United States Patent
Liu et al.

(10) Patent No.: US 9,825,175 B2
(45) Date of Patent: Nov. 21, 2017

(54) THIN FILM TRANSISTOR INCLUDING DIFFUSION BLOCKING LAYER AND FABRICATION METHOD THEREOF, ARRAY SUBSTRATE AND DISPLAY DEVICE

(71) Applicant: BOE Technology Group Co., Ltd., Beijing (CN)

(72) Inventors: Wei Liu, Beijing (CN); Chunsheng Jiang, Beijing (CN); Lung Pao Hsin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/905,068

(22) PCT Filed: Aug. 14, 2015

(86) PCT No.: PCT/CN2015/087010
§ 371 (c)(1),
(2) Date: Jan. 14, 2016

(87) PCT Pub. No.: WO2016/110100
PCT Pub. Date: Jul. 14, 2016

(65) Prior Publication Data
US 2016/0372603 A1    Dec. 22, 2016

(30) Foreign Application Priority Data
Jan. 5, 2015  (CN) .......................... 2015 1 0004067

(51) Int. Cl.
*H01L 29/10* (2006.01)
*H01L 29/786* (2006.01)
(Continued)

(52) U.S. Cl.
CPC ........ *H01L 29/78618* (2013.01); *H01L 21/44* (2013.01); *H01L 21/47635* (2013.01);
(Continued)

(58) Field of Classification Search
CPC .......................... H01L 29/78618; H01L 21/44
(Continued)

(56) References Cited

U.S. PATENT DOCUMENTS

2012/0043548 A1   2/2012  Arai et al.
2014/0027761 A1*  1/2014  Chou ................ H01L 29/66969
                                                          257/43
(Continued)

FOREIGN PATENT DOCUMENTS

CN   1090946 A    8/1994
CN   1897270 A    1/2007
(Continued)

OTHER PUBLICATIONS

Oct. 29, 2015—(WO)—International Search Report and Written Opinion Appn PCT/CN2015/087010 with English Tran.
(Continued)

*Primary Examiner* — Caleb Henry
(74) *Attorney, Agent, or Firm* — Banner & Witcoff, Ltd.

(57) ABSTRACT

A thin film transistor and a fabrication method thereof, an array substrate and a display device are provided. The thin film transistor includes: an active layer, a source-drain metal layer and a diffusion blocking layer located between the active layer and the source-drain metal layer, wherein, the source-drain metal layer includes a source electrode and a drain electrode; the diffusion blocking layer includes a source blocking part corresponding to a position of the source electrode and a drain blocking part corresponding to a position of the drain electrode; and the diffusion blocking layer is doped with different concentrations of nitrogen from a side close to the source-drain metal layer to a side close to the active layer.

20 Claims, 3 Drawing Sheets

(51) Int. Cl.
  *H01L 21/44* (2006.01)
  *H01L 21/4763* (2006.01)
  *H01L 29/45* (2006.01)
  *H01L 29/66* (2006.01)

(52) U.S. Cl.
  CPC ........ *H01L 29/45* (2013.01); *H01L 29/66969* (2013.01); *H01L 29/786* (2013.01); *H01L 29/7869* (2013.01)

(58) Field of Classification Search
  USPC .......................................... 257/43
  See application file for complete search history.

(56) References Cited

U.S. PATENT DOCUMENTS

| | | |
|---|---|---|
| 2014/0061631 A1 | 3/2014 | Lee et al. |
| 2014/0110702 A1* | 4/2014 | Cheng ................ H01L 29/7869 257/43 |
| 2014/0346502 A1* | 11/2014 | Matsukizono ...... H01L 29/7869 257/43 |

FOREIGN PATENT DOCUMENTS

| | | |
|---|---|---|
| CN | 103227208 A | 7/2013 |
| CN | 103229301 A | 7/2013 |
| CN | 103531640 A | 1/2014 |
| CN | 104600123 A | 5/2015 |
| JP | 2150067 A | 6/1990 |

OTHER PUBLICATIONS

Jan. 12, 2017—(CN) First Office Action Appn 201510004067.7 with English Tran.

* cited by examiner

THIN FILM TRANSISTOR INCLUDING DIFFUSION BLOCKING LAYER AND FABRICATION METHOD THEREOF, ARRAY SUBSTRATE AND DISPLAY DEVICE

The application is a U.S. National Phase Entry of International Application No. PCT/CN2015/087010 filed on Aug. 14, 2015, designating the United States of America and claiming priority to Chinese Patent Application No. 201510004067.7 filed on Jan. 5, 2015. The present application claims priority to and the benefit of the above-identified applications and the above-identified applications are incorporated by reference herein in their entirety.

TECHNICAL FIELD

At least one embodiment of the present invention relates to a thin film transistor and a fabrication method thereof, an array substrate and a display device.

BACKGROUND

Figure 1:
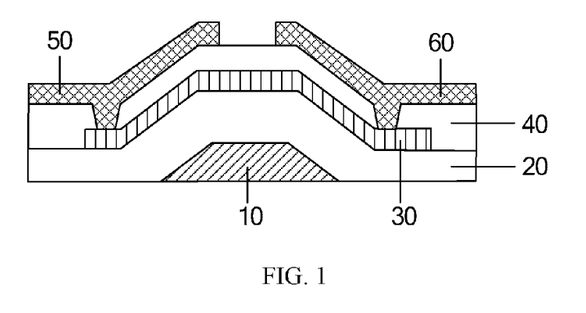
FIG. 1 is a structural schematic diagram of a thin film transistor.

As an important field effect transistor, a thin film transistor is widely used in a technical field of display. As illustrated in FIG. 1, the thin film transistor mainly includes a gate electrode 10, a gate insulating layer 20, an active layer 30, an etch barrier layer 40, a source electrode 50 and a drain electrode 60. Copper may be selected as an electrode material for forming the source electrode 50 and the drain electrode 60, and a thin film transistor thus formed has an advantage of good conductivity.

Since the copper has certain diffusibility, when the thin film transistor is turned on, the copper will diffuse into the active layer, affecting conductivity of the active layer. Therefore, in the prior art, the copper is not used alone, but a multi-layer structure is used. For example, at least a diffusion blocking layer and a copper layer are included, wherein, the blocking layer is usually made of molybdenum niobium (MoNb), for blocking the copper from diffusing into the active layer.

However, inventors found that the prior art at least has problems as follows: the thicker the diffusion blocking layer is, the better the effect of blocking the copper from diffusing into the active layer is; but manufacturers have strict requirements on cost and thickness of a device, so it is not possible to make the diffusion blocking layer too thick. Meanwhile, in order to improve performance of the device, after forming a thin film transistor, an annealing process will be performed thereon; the annealing process needs to be implemented in a high temperature environment, and the copper diffuses aggressively at high temperature. The diffusion blocking layer is poor in preventing the copper from diffusing due to these two reasons, further affecting conductivity of the active layer, thereby affecting performance of the thin film transistor.

SUMMARY

At least one embodiment of the present invention provides a thin film transistor and a fabrication method thereof, an array substrate and a display device, to improve a problem that a diffusion blocking layer is poor in preventing metal (e.g., copper) from diffusing in the prior art.

At least one embodiment of the present invention provides a thin film transistor, comprising: an active layer, a source-drain metal layer and a diffusion blocking layer located between the active layer and the source-drain metal layer, wherein, the source-drain metal layer includes a source electrode and a drain electrode, and the diffusion blocking layer includes a source blocking part corresponding to a position of the source electrode and a drain blocking part corresponding to a position of the drain electrode; and the diffusion blocking layer is doped with different concentrations of nitrogen from a side close to the source-drain metal layer to a side close to the active layer.

For example, in the thin film transistor provided by one embodiment of the present invention, the concentrations of nitrogen doped into the diffusion blocking layer from the side close to the source-drain metal layer to the side close to the active layer decrease sequentially.

For example, in the thin film transistor provided by one embodiment of the present invention, the concentrations of nitrogen doped into the diffusion blocking layer are within a range of 10% to 50%.

For example, in the thin film transistor provided by one embodiment of the present invention, a concentration of nitrogen doped into a side of the diffusion blocking layer in contact with the source-drain metal layer is 50%, and a concentration of nitrogen doped into a side of the diffusion blocking layer in contact with the active layer is 10%.

For example, in the thin film transistor provided by one embodiment of the present invention, the diffusion blocking layer has a thickness within a range of 300 Å to 500 Å.

For example, in the thin film transistor provided by one embodiment of the present invention, a material for forming the active layer includes indium gallium zinc oxide or indium tin zinc oxide.

For example, the thin film transistor provided by one embodiment of the present invention further comprises an etch barrier layer located between the diffusion blocking layer and the active layer, wherein, a via hole is formed in the etch barrier layer, and the diffusion blocking layer is in direct contact with the active layer through the via hole.

For example, in the thin film transistor provided by one embodiment of the present invention, a material of the diffusion blocking layer includes a conductive material including molybdenum.

For example, in the thin film transistor provided by one embodiment of the present invention, a material of the source-drain metal layer includes a conductive material including copper.

For example, in the thin film transistor provided by one embodiment of the present invention, the thin film transistor further comprises a gate metal layer and a gate insulating layer, wherein, the gate metal layer includes a gate electrode.

At least one embodiment of the present invention provides an array substrate, comprising any thin film transistor described above.

At least one embodiment of the present invention provides a display device, comprising the array substrate described above.

At least one embodiment of the present invention provides a fabrication method of a thin film transistor, comprising: forming an active layer; forming a source-drain metal layer, wherein, the source-drain metal layer includes a source electrode and a drain electrode; forming a diffusion blocking layer, wherein, the diffusion blocking layer is formed between the active layer and the source-drain metal layer, and the formed diffusion blocking layer is doped with different concentrations of nitrogen from a side close to the source-drain metal layer to a side close to the active layer; and the diffusion blocking layer includes a source blocking part corresponding to a position of the source electrode and a drain blocking part corresponding to a position of the drain electrode.

For example, in the fabrication method of the thin film transistor provided by one embodiment of the present invention, forming the diffusion blocking layer includes: forming a diffusion blocking film; doping nitrogen into the diffusion blocking film by an ion implantation process.

For example, in the fabrication method of the thin film transistor provided by one embodiment of the present invention, forming the diffusion blocking layer includes: forming a diffusion blocking film; doping nitrogen into the diffusion blocking film by a sputtering deposition process.

For example, in the fabrication method of the thin film transistor provided by one embodiment of the present invention, after forming the active layer, before forming the diffusion blocking layer, the fabrication method further comprises: forming an etch barrier layer, wherein, a via hole is formed in the etch barrier layer, and the diffusion blocking layer is in direct contact with the active layer through the via hole.

For example, in the fabrication method of the thin film transistor provided by one embodiment of the present invention, a material of the diffusion blocking layer includes a conductive material including molybdenum.

For example, in the fabrication method of the thin film transistor provided by one embodiment of the present invention, a material of the source-drain metal layer includes a conductive material including copper.

For example, in the fabrication method of the thin film transistor provided by one embodiment of the present invention, the fabrication method of the thin film transistor further comprises forming a gate metal layer and a gate insulating layer, wherein, the gate metal layer includes a gate electrode.

BRIEF DESCRIPTION OF THE DRAWINGS

In order to clearly illustrate the technical solution in the embodiments of the present disclosure or in the prior art, the drawings necessary for description of the embodiments or the prior art will be briefly described hereinafter; it is obvious that the described drawings are only related to some embodiments of the present disclosure, for which one ordinarily skilled in the art still can obtain other drawings without inventive work based on these drawings.

REFERENCE SIGNS

10—gate electrode;
20—gate insulating layer;
30—active layer;
40—etch barrier layer;
50—source drain;
60—drain electrode;
70—source blocking part;
80—drain blocking part;
56—source-drain metal layer;
78—diffusion blocking layer.

DETAILED DESCRIPTION

Hereinafter, the technical solutions of the embodiment will be described in a clearly and fully understandable way in conjunction with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

It should be noted that, the "above", "below" described in the embodiment of the present invention are based on a sequence for forming layer structures; a layer structure formed previously is located below, and a layer structure formed later is located above.

Figure 2:
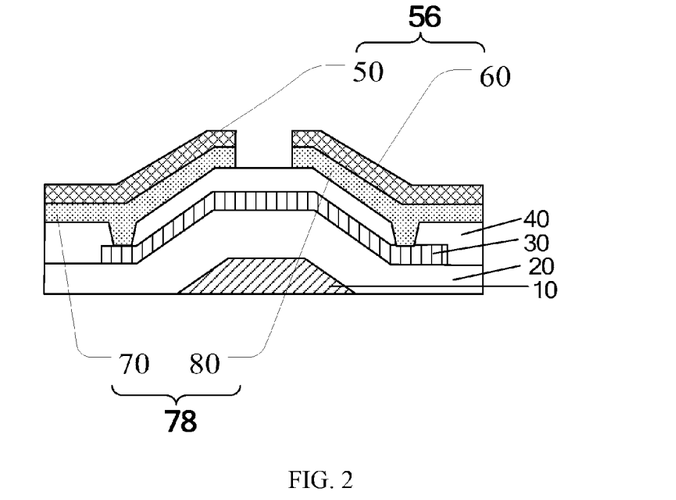
FIG. 2 is a structural schematic diagram of a thin film transistor provided by an embodiment of the present invention.

An embodiment of the present invention provides a thin film transistor, as illustrated in FIG. 2, including: a gate metal layer, a gate insulating layer 20, an active layer 30 and a source-drain metal layer 56. The gate metal layer includes a gate electrode 10, and the source-drain metal layer includes a source electrode 50 and a drain electrode 60. The thin film transistor further includes a diffusion blocking layer 78 located between the active layer 30 and the source-drain metal layer, and the diffusion blocking layer 78 includes a source blocking part 70 corresponding to a position of the source electrode 50 and a drain blocking part 80 corresponding to a position of the drain electrode 60. The diffusion blocking layer, for example, is made of a conductive material including molybdenum, and the diffusion blocking layer is doped with different concentrations of nitrogen from a side close to the source-drain metal layer 56 to a side close to the active layer.

The source-drain metal layer, for example, is made of a conductive material including copper, but is not limited thereto. The source-drain metal layer may also be made of other conductive materials. That is, a material of the source-drain metal layer includes a conductive material including copper. The diffusion blocking layer provided by respective embodiments of the present invention may effectively prevent a metal in the source-drain metal layer from diffusing into the active layer.

In the thin film transistor described above, a material of the active layer is not limited in the embodiment of the present invention, the active layer may be made of a silicon-based material, or may be made of a metal oxide material, which is not limited here, and may be determined according to actual situation. In addition, the material for forming the source-drain metal layer is not limited in the embodiment of the present invention, for example, the source-drain metal layer may be made of a conductive material containing copper. Exemplarily, the source-drain metal layer may be made of copper, may be made of copper alloy, or may be made of other conductive materials containing copper, which is determined according to actual situation. Meanwhile, a material for forming the diffusion blocking layer is not limited in the embodiment of the present invention. For example, the diffusion blocking layer may be made of a conductive material containing molybdenum. For example, the diffusion blocking layer may be made of molybdenum, may be made of a molybdenum-niobium alloy, or may be made of other conductive material including molybdenum, which may be determined according to actual situation. That is, the material of the diffusion blocking layer includes a conductive material containing molybdenum. Other appropriate conductive material may also be used. In the respective embodiments of the present disclosure, it is described by taking an example of a conductive material including molybdenum.

In the thin film transistor described above, distribution of nitrogen in the diffusion blocking layer is not limited in the embodiment of the present invention, as long as concentrations of nitrogen doped into the diffusion blocking layer are different from a side close to the source-drain metal layer to a side close to the active layer. Exemplarily, the diffusion blocking layer may include at least two sub-layers, and concentrations of nitrogen doped into two adjacent sub-layers are different. Of course, the diffusion blocking layer may further be doped with nitrogen having continuously changed concentrations.

It should be noted that, the thin film transistor may be divided into two types according to positional relationship of electrodes. One type is that a gate electrode is located below a source electrode and a drain electrode, and this type is called a thin film transistor of bottom-gate type. The other type is that a gate electrode is located above a source electrode and a drain electrode, and this type is called a thin film transistor of top-gate type. The type of the thin film transistor is not limited in the embodiment of the present invention, which may be determined according to actual situation. The embodiment of the present invention and accompanying drawings take an example of a thin film transistor of bottom-gate type for description.

The thin film transistor has a diffusion blocking layer arranged between the active layer and the source-drain metal layer; the source-drain metal layer is made of a conductive material including molybdenum, and the diffusion blocking layer is doped with different concentrations of nitrogen from the side close to the source-drain metal layer to the side close to the active layer. In this way, in one aspect, since the molybdenum is doped with nitrogen, an effect of the diffusion blocking layer in preventing copper of the source-drain metal layer from diffusing into the active layer is enhanced. In another aspect, the higher the concentration of nitrogen doped into the molybdenum is, the better the effect of preventing copper from diffusing is, but a resistance thereof is growing therewith, and too great resistance may affect conductivity between the active layer and the source-drain metal layer, so the diffusion blocking layer is doped with different concentrations of nitrogen from the side close to the source-drain metal layer to the side close to the active layer, to make total concentration of nitrogen doped into the diffusion blocking layer not too high, which not only ensures the effect of the diffusion blocking layer in preventing copper from diffusing, but also not too great resistance of the diffusion blocking layer.

Further, for example, the concentrations of nitrogen doped into the diffusion blocking layer from the side close to the source-drain metal layer to the side close to the active layer decrease sequentially. In this way, the concentration of nitrogen doped into the diffusion blocking layer on the side close to the source-drain metal layer is higher, which benefits for preventing copper of the source-drain metal layer from diffusing into the active layer. The concentrations of nitrogen doped into the diffusion blocking layer decrease sequentially, so a total concentration of nitrogen doped into the diffusion blocking layer further decreases, and thus the resistance of the diffusion blocking layer further decreases, and finally the conductivity between the source-drain metal layer and the active layer is further improved.

Here, it should be noted that, in a case where the diffusion blocking layer includes at least two sub-layers, the concentrations of nitrogen doped into the diffusion blocking layer decrease sequentially, which is, for example, that: at least the concentrations of nitrogen doped into the two sub-layers decrease sequentially from a side close to the source-drain metal layer to a side close to the active layer. In this way, the concentration of nitrogen doped into the diffusion blocking layer on the side close to the source-drain metal layer is higher, which benefits for preventing copper of the source-drain metal layer from diffusing into the active layer. At least the concentrations of nitrogen doped into the two sub-layers decrease sequentially, so a total concentration of nitrogen doped into the diffusion blocking layer further decreases, and thus the resistance of the diffusion blocking layer further decreases, and finally the conductivity between the source-drain metal layer and the active layer is further improved.

Further, if the concentration of nitrogen doped into the diffusion blocking layer is too high, the resistance of the diffusion blocking layer is much higher than that of the diffusion blocking layer without doping nitrogen, which may significantly affect the conductivity between the source-drain metal layer and the active layer. Exemplarily, experiments show that: molybdenum metal having a thickness of 2200 Å has a resistance of 0.55, and a molybdenum nitride doped with 50% nitrogen has a resistance of 5.6. In order to ensure the conductivity between the source-drain metal layer and the active layer, the concentrations of nitrogen doped into the diffusion blocking layer, for example, may be within a range of 10% to 50%.

Further, for example, a concentration of nitrogen doped into a side of the diffusion blocking layer in contact with the source-drain metal layer may be 50%, and a concentration of nitrogen doped into a side of the diffusion blocking layer in contact with the active layer may be 10%, which much benefits for preventing copper of the source-drain metal layer from diffusing into the active layer, and ensures the conductivity between the source-drain metal layer and the active layer at the same time.

Here, it should be noted that, in a case where the diffusion blocking layer includes at least two sub-layers, a concentration of nitrogen doped into a side of the diffusion blocking layer in contact with the source-drain metal layer may be 50%, which is, for example, that: a concentration of nitrogen doped into a sub-layer of the diffusion blocking layer in contact with the source-drain metal layer may be 50%; and a concentration of nitrogen doped into a side of the diffusion blocking layer in contact with the active layer may be 10%, which is, for example, that: a concentration of nitrogen doped into a sub-layer of the diffusion blocking layer in contact with the active layer may be 10%, which much benefits for preventing copper of the source-drain metal layer from diffusing into the active layer, and ensures the conductivity between the source-drain metal layer and the active layer at the same time.

For example, in order to save cost, the diffusion blocking layer may have a thickness within a range of 300 Å to 500 Å.

For example, the active layer may be made of indium gallium zinc oxide or indium tin zinc oxide, and a thin film transistor thus formed has characteristics such as high mobility ratio and high contrast.

For example, in order to protect the active layer, as illustrated in FIG. 2, the thin film transistor further includes an etch barrier layer 40 located between the diffusion blocking layer and the active layer 30, and a via hole (not illustrated, please refer to FIG. 6) is formed in the etch barrier layer 40, and the diffusion blocking layer is in direct contact with the active layer 30 through the via hole. For example, a source blocking part 70 and a drain blocking part 80 are in direct contact with the active layer 30 through the via hole.

Another embodiment of the present invention further provides an array substrate, including any thin film transistor provided by the embodiments of the present invention. A display device formed by the array substrate has characteristics such as good display performance and longer service life.

Another embodiment of the present invention further provides a display device, including the array substrate provided by the embodiments of the present invention.

For example, the display device may be a liquid crystal display, E-paper, an Organic Light-Emitting Diode (OLED) display or any other display device, or any other product or component having a display function, such as a television, a digital camera, a mobile phone, a watch, a laptop computer, a tablet computer, and a navigator which includes these display devices.

Another embodiment of the present invention further provides a fabrication method of a thin film transistor, including: forming a gate metal layer and a gate insulating layer, wherein, the gate metal layer includes a gate electrode; forming an active layer; forming a diffusion blocking layer, wherein, the diffusion blocking layer including molybdenum is formed, and the formed diffusion blocking layer is doped with different concentrations of nitrogen from a side close to the source-drain metal layer to a side close to the active layer; and the diffusion blocking layer includes a source blocking part corresponding to a position of the source electrode and a drain blocking part corresponding to a position of the drain electrode; and forming a source-drain metal layer, wherein, the source-drain metal layer is made of a conductive material including copper; wherein, the diffusion blocking layer is formed between the active layer and the source-drain metal layer.

It should be noted that, in the fabrication method of the thin film transistor described above, a thin film transistor of bottom-gate type having a gate electrode formed below a source electrode and a drain electrode may be formed, or a thin film transistor of top-gate type having a gate electrode formed above a source electrode and a drain electrode may be formed, which is not limited in the embodiment of the present invention, and may be determined according to actual situation. The embodiment of the present invention and accompanying drawings take an example of a thin film transistor of bottom-gate type for description.

It should be further noted that, methods of doping nitrogen into the diffusion blocking layer may be implemented in many manners, which is not limited here. For example, nitrogen is doped into the diffusion blocking layer by an ion implantation process, or nitrogen is doped into the diffusion blocking layer by a sputtering deposition process. In a case where nitrogen is doped into the diffusion blocking layer by an ion implantation process, concentrations of nitrogen in the diffusion blocking layer thus formed change continuously, which much benefits for preventing copper of the source-drain metal layer from diffusing into the active layer. The embodiment of the present invention takes an example of doping nitrogen into the diffusion blocking layer by an ion implantation process for description.

In the fabrication method of the thin film transistor, a diffusion blocking layer including molybdenum is formed between the active layer and the source-drain metal layer, and the formed diffusion blocking layer is doped with different concentrations of nitrogen from a side close to the source-drain metal layer to a side close to the active layer. In this way, in one aspect, since the molybdenum is doped with nitrogen, an effect of the diffusion blocking layer in preventing copper of the source-drain metal layer from diffusing into the active layer is enhanced. In another aspect, the higher the concentration of nitrogen doped into the molybdenum is, the better the effect of preventing copper from diffusing is, but a resistance thereof is growing therewith, and too great resistance may affect conductivity between the active layer and the source-drain metal layer, so the diffusion blocking layer is doped with different concentrations of nitrogen from the side close to the source-drain metal layer to the side close to the active layer, to make total concentration of nitrogen doped into the diffusion blocking layer not too high, which not only ensures the effect of the diffusion blocking layer in preventing copper from diffusing, but also not too great resistance of the diffusion blocking layer.

For example, forming the diffusion blocking layer includes: forming a diffusion blocking film including molybdenum; and doping nitrogen into the diffusion blocking film by an ion implantation process. Here, it should be noted that, the ion implantation process has characteristics as follows: concentrations of ion implanted is continuously changed, so the concentrations of nitrogen doped into the diffusion blocking film may meet certain requirements by setting different implanting conditions (for example, an implanting power, an implanting time and so on). For example, by setting related parameters, the concentrations of nitrogen doped into the diffusion blocking layer from the side close to the source-drain metal layer to the side close to the active layer may increase sequentially, or decrease sequentially, or increase sequentially at first and then decrease sequentially, which may be determined according to actual situation. The concentrations of nitrogen doped into the diffusion blocking layer from the side close to the source-drain metal layer to the side close to the active layer decrease sequentially, which much benefits for preventing copper of the source-drain metal layer from diffusing into the active layer.

For example, forming the diffusion blocking layer includes: forming a diffusion blocking film including molybdenum; and doping nitrogen into the diffusion blocking film by a sputtering deposition process. Here, it should be noted that, multiple layers of nitrogen may be doped into the diffusion blocking film by a sputtering deposition process, and concentrations of nitrogen doped into two adjacent layers may be different. For example, by setting technical parameters such as an input nitrogen flow, a sputtering power, a sputtering time and so on, a layer of nitrogen with a certain concentration is doped into the diffusion blocking film by a one-time sputtering deposition process; and the concentration may be determined by technical parameters such as an input nitrogen flow, a sputtering power, a sputtering time and so on. In a process of doping the multiple layers of nitrogen into the diffusion blocking film by multiple times of sputtering deposition processes, and different concentrations of nitrogen may be doped into the diffusion blocking film by changing the above technical parameters.

In this way, from the side close to the source-drain metal layer to the side close to the active layer, by the sputtering deposition process described above, the multiple layers of nitrogen may be doped into the diffusion blocking film and the concentrations of nitrogen doped into two adjacent layers increase sequentially, or the multiple layers of nitrogen may be doped into the diffusion blocking film and the concentrations of nitrogen doped into two adjacent layers decrease sequentially. Of course, there may be other cases, which may be determined according to actual situation. The multiple layers of nitrogen are doped into the diffusion blocking film from the side close to the source-drain metal layer to the side close to the active layer and the concentrations of nitrogen doped into two adjacent layers decrease sequentially, which much benefits for preventing copper of the source-drain metal layer from diffusing into the active layer.

Further, in order to protect the active layer, after forming the active layer, before forming the diffusion blocking layer, the fabrication method further includes: forming an etch barrier layer, a via hole being formed in the etch barrier layer; and the diffusion blocking layer being in direct contact with the active layer through the via hole.

Figure 3:
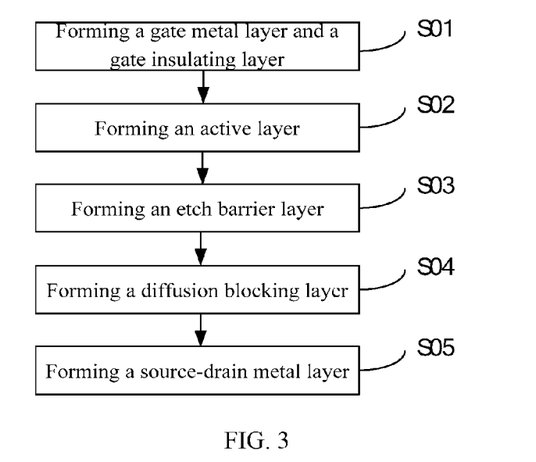
FIG. 3 is a flow chart of a fabrication method of a thin film transistor provided by an embodiment of the present invention.

Hereinafter, the fabrication method of the thin film transistor is described by taking an example of a thin film transistor of bottom-gate type including an etch barrier layer; as illustrated in FIG. 3, the method includes the following steps.

Figure 4:
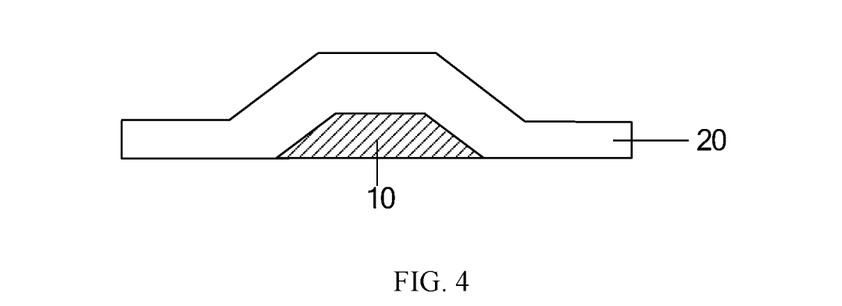
FIG. 4 is a schematic diagram of step S01 in FIG. 3.

Step S01: as illustrated in FIG. 4, forming a gate metal layer and a gate insulating layer 20, wherein, the gate metal layer includes a gate electrode 10, and the gate insulating layer 20 covers the gate electrode 10.

Figure 5:
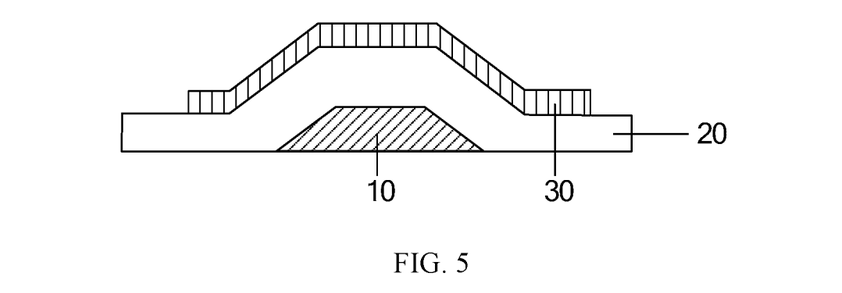
FIG. 5 is a schematic diagram of step S02 in FIG. 3.

Step S02: as illustrated in FIG. 5, forming an active layer 30. For example, the active layer may be made of indium gallium zinc oxide or indium tin zinc oxide.

Figure 6:
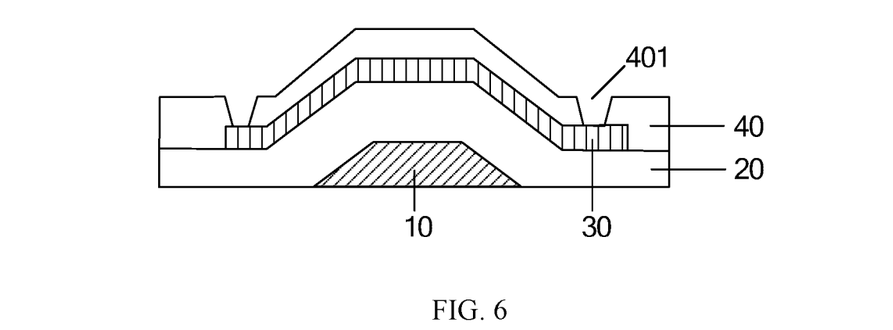
FIG. 6 is a schematic diagram of step S03 in FIG. 3.

Step S03: as illustrated in FIG. 6, forming an etch barrier layer 40, wherein, a via hole 401 is formed in the etch barrier layer 40.

Figure 7:
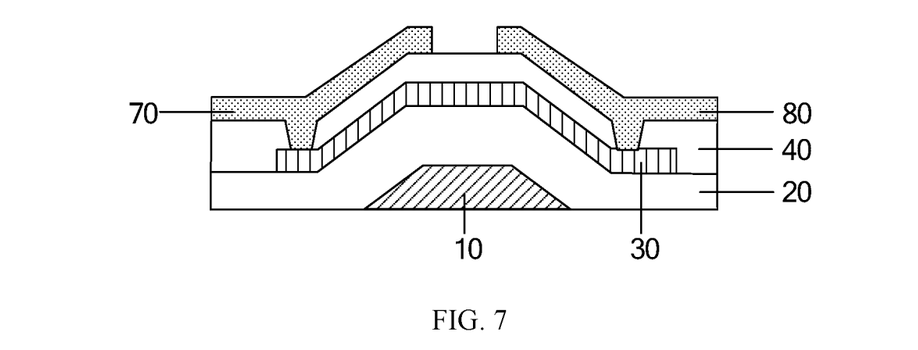
FIG. 7 is a schematic diagram of step S04 in FIG. 3.

Step S04: as illustrated in FIG. 7, forming a diffusion blocking layer, wherein, the diffusion blocking layer includes a source blocking part 70 corresponding to a position of the source electrode and a drain blocking part 80 corresponding to a position of the drain electrode. The diffusion blocking layer, for example, is made of a conductive material including molybdenum, and is doped with nitrogen. A diffusion blocking layer including molybdenum is formed, and the formed diffusion blocking layer is doped with different concentrations of nitrogen from a side close to the source-drain metal layer to a side close to the active layer. Meanwhile, the diffusion blocking layer is in direct contact with the active layer 30 through the via hole 401 formed in step S03.

Step S05: as illustrated in FIG. 2, forming a source-drain metal layer, wherein, the source-drain metal layer includes a source electrode 50 and a drain electrode 70, and the source-drain metal layer, for example, is made of a conductive material including copper.

It should be noted that, in respective embodiments of the present invention, the diffusion blocking layer is formed before the source-drain metal layer is formed.

Figure 8:
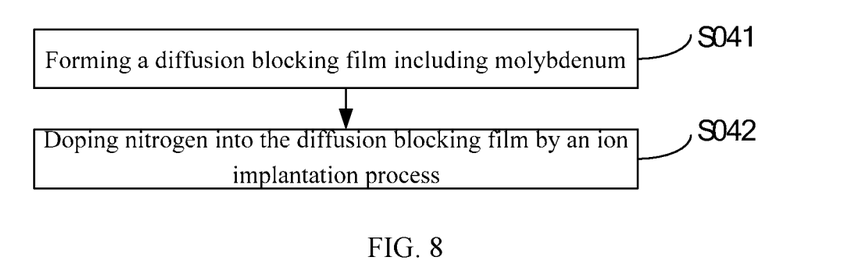
FIG. 8 is a flow chart of a fabrication method of step S04 in FIG. 3.

Further, the above step S04, for example, as illustrated in FIG. 8, includes:

S041: forming a diffusion blocking film including molybdenum, wherein, the diffusion blocking layer, for example, may have a thickness within a range of 300 Å to 500 Å.

S042: doping nitrogen into the diffusion blocking film by an ion implantation process. For example, nitrogen may be doped into the diffusion blocking film by an ion implanting machine, and different concentrations of nitrogen may be doped into the diffusion blocking film by controlling related parameters such as an implanting time and so on. For example, from a side close to the source-drain metal layer to a side close to the active layer, the concentrations of nitrogen doped into the diffusion blocking layer may decrease from 50% to 10%, sequentially. Thus, a concentration of nitrogen doped into a side of the diffusion blocking layer close to the source-drain metal layer is relatively high, which benefits for preventing copper of the source-drain metal layer from diffusing into the active layer. The concentrations of nitrogen doped into the diffusion blocking layer decrease sequentially, so a total concentration of nitrogen doped into the diffusion blocking layer further decreases. And thus, the resistance of the diffusion blocking layer further decreases, and finally the conductivity between the source-drain metal layer and the active layer is further improved.

At least one embodiment of the present invention provides a thin film transistor and a fabrication method thereof, an array substrate and a display device, and the thin film transistor and the fabrication method thereof have at least one of advantageous effects as follows:

(1) The thin film transistor has a diffusion blocking layer arranged between the active layer and the source-drain metal layer, and the diffusion blocking layer is doped with different concentrations of nitrogen from a side close to the source-drain metal layer to a side close to the active layer; in this way, in one aspect, since the diffusion blocking layer is doped with nitrogen, an effect of the diffusion blocking layer in preventing metal (e.g., copper) of the source-drain metal layer from diffusing into the active layer is enhanced; in another aspect, the higher the concentration of nitrogen doped into the diffusion blocking layer is, the better the effect of preventing metal (e.g., copper) from diffusing is, but a resistance thereof is growing therewith, and too great resistance may affect conductivity between the active layer and the source-drain metal layer, so the diffusion blocking layer is doped with different concentrations of nitrogen from the side close to the source-drain metal layer to the side close to the active layer, to make a total concentration of nitrogen doped into the diffusion blocking layer not too high, which not only ensures the effect of the diffusion blocking layer in preventing metal (e.g., copper) from diffusing, but also ensures not too great resistance of the diffusion blocking layer.

(2) The concentrations of nitrogen doped into the diffusion blocking layer from the side close to the source-drain metal layer to the side close to the active layer decrease sequentially. In this way, the concentration of nitrogen doped into the diffusion blocking layer on the side close to the source-drain metal layer is higher, which benefits for preventing metal (e.g., copper) of the source-drain metal layer from diffusing into the active layer. The concentrations of nitrogen doped into the diffusion blocking layer decrease sequentially, so a total concentration of nitrogen doped into the diffusion blocking layer further decreases, and thus the resistance of the diffusion blocking layer further decreases, and finally the conductivity between the source-drain metal layer and the active layer is further improved.

(3) The diffusion blocking layer may be made of a conductive material including molybdenum, which has suitable conductivity as a blocking layer.

There are some points to be illustrated:

(1) Drawings of the embodiments of the present disclosure only refer to structures related with the embodiments of the present invention, and other structures may refer to general design.

(2) In order to make it clear, in the drawings for illustrating the embodiments of the present disclosure, a thickness of a layer or a region is magnified or reduced, that is, those drawings are not drawn according to actual proportion. It should be understood that, when elements such as a layer, a film, a region or a substrate and the like are called to be "above" or "below" another element, the element may be directly located "above" or "below" the other element, or there may be an intermediate element.

(3) In a case of no conflict, the embodiments of the present disclosure and the features of the embodiments may be combined with each other to form new embodiments.

The foregoing is only specific embodiment of the present invention, but the protection scope of the present invention is not limited thereto. In the technical scope disclosed by the present disclosure, changes or substitutions easily thought by any skilled in the art are all covered in the protection scope of the present disclosure. Therefore, the protection scope of the present invention should be the protection scope of the claims.

The application claims priority of Chinese Patent Application No. 201510004067.7 filed on Jan. 5, 2015, the disclosure of which is incorporated herein by reference in its entirety as part of the present application.

The invention claimed is:

1. A thin film transistor, comprising: an active layer, a source-drain metal layer and a diffusion blocking layer located between the active layer and the source-drain metal layer, wherein, the source-drain metal layer includes a source electrode and a drain electrode, and the diffusion blocking layer includes a source blocking part corresponding to a position of the source electrode and a drain blocking part corresponding to a position of the drain electrode; and the diffusion blocking layer is doped with different concentrations of nitrogen from a side close to the source-drain metal layer to a side close to the active layer; and the source blocking part and the drain blocking part are conductive and spaced apart from each other, and a side of the diffusion blocking layer in contact with the active layer is nitrogen-doped.

2. The thin film transistor according to claim 1, wherein, the concentrations of nitrogen doped into the diffusion blocking layer from the side close to the source-drain metal layer to the side close to the active layer decrease sequentially.

3. The thin film transistor according to claim 1, wherein, the concentrations of nitrogen doped into the diffusion blocking layer are within a range of 10% to 50%.

4. A thin film transistor, comprising: an active layer, a source-drain metal layer and a diffusion blocking layer located between the active layer and the source-drain metal layer, wherein, the source-drain metal layer includes a source electrode and a drain electrode, and the diffusion blocking layer includes a source blocking part corresponding to a position of the source electrode and a drain blocking part corresponding to a position of the drain electrode; and the diffusion blocking layer is doped with different concentrations of nitrogen from a side close to the source-drain metal layer to a side close to the active layer, and the concentrations of nitrogen doped into the diffusion blocking layer are within a range of 10% to 50%, and a concentration of nitrogen doped into a side of the diffusion blocking layer in contact with the source-drain metal layer is 50%, and a concentration of nitrogen doped into a side of the diffusion blocking layer in contact with the active layer is 10%.

5. The thin film transistor according to claim 1, wherein, the diffusion blocking layer has a thickness within a range of 300 Å to 500 Å.

6. The thin film transistor according to claim 1, wherein, a material for forming the active layer includes indium gallium zinc oxide or indium tin zinc oxide.

7. The thin film transistor according to claim 1, further comprising an etch barrier layer located between the diffusion blocking layer and the active layer, wherein, a via hole is formed in the etch barrier layer, and the diffusion blocking layer is in direct contact with the active layer through the via hole.

8. The thin film transistor according to claim 1, wherein a material of the diffusion blocking layer includes a conductive material including molybdenum.

9. The thin film transistor according to claim 1, wherein a material of the source-drain metal layer includes a conductive material including copper.

10. The thin film transistor according to claim 1, further comprising a gate metal layer and a gate insulating layer, wherein, the gate metal layer includes a gate electrode.

11. An array substrate, comprising the thin film transistor according to claim 1.

12. A display device, comprising the array substrate according to claim 11.

13. A fabrication method of a thin film transistor, comprising:

forming an active layer;

forming a source-drain metal layer, wherein, the source-drain metal layer includes a source electrode and a drain electrode;

forming a diffusion blocking layer, wherein, the diffusion blocking layer is formed between the active layer and the source-drain metal layer, and the formed diffusion blocking layer is doped with different concentrations of nitrogen from a side close to the source-drain metal layer to a side close to the active layer; and the diffusion blocking layer includes a source blocking part corresponding to a position of the source electrode and a drain blocking part corresponding to a position of the drain electrode; and wherein the source blocking part and the drain blocking part are conductive and spaced apart from each other, and a side of the diffusion blocking layer in contact with the active layer is nitrogen-doped.

14. The fabrication method according to claim 13, wherein, forming the diffusion blocking layer includes:

forming a diffusion blocking film; and doping nitrogen into the diffusion blocking film by an ion implantation process.

15. The fabrication method according to claim 13, wherein, forming the diffusion blocking layer includes:

forming a diffusion blocking film; and doping nitrogen into the diffusion blocking film by a sputtering deposition process.

16. The fabrication method according to claim 13, after forming the active layer, before forming the diffusion blocking layer, the fabrication method further comprising: forming an etch barrier layer, wherein, a via hole is formed in the etch barrier layer, and the diffusion blocking layer is in direct contact with the active layer through the via hole.

17. The fabrication method according to claim 13, wherein a material of the diffusion blocking layer includes a conductive material including molybdenum.

18. The fabrication method according to claim 13, wherein a material of the source-drain metal layer includes a conductive material including copper.

19. The fabrication method according to claim 13, further comprising forming a gate metal layer and a gate insulating layer, wherein, the gate metal layer includes a gate electrode.

20. The thin film transistor according to claim 2, wherein, the concentrations of nitrogen doped into the diffusion blocking layer are within a range of 10% to 50%.

* * * * *